(12) United States Patent
Gasiot et al.

(10) Patent No.: US 7,542,333 B2
(45) Date of Patent: Jun. 2, 2009

(54) LOGIC CELL PROTECTED AGAINST RANDOM EVENTS

(75) Inventors: Gilles Gasiot, Grenoble (FR); François Jacquet, Froges (FR); Philippe Roche, Le Versoud (FR)

(73) Assignee: STMicroelectronics SA, Montrouge (FR)

( * ) Notice: Subject to any disclaimer, the term of this patent is extended or adjusted under 35 U.S.C. 154(b) by 103 days.

(21) Appl. No.: 11/844,025

(22) Filed: Aug. 23, 2007

(65) Prior Publication Data

US 2008/0049524 A1  Feb. 28, 2008

(30) Foreign Application Priority Data

Aug. 24, 2006  (FR) .................................. 06 53444

(51) Int. Cl.
*G11C 11/00* (2006.01)
(52) U.S. Cl. ........................ 365/156; 365/173; 365/174; 365/181
(58) Field of Classification Search ................. 365/154, 365/156, 171, 173, 174, 181, 190
See application file for complete search history.

(56) References Cited

U.S. PATENT DOCUMENTS

| | | | |
|---|---|---|---|
| 3,284,782 A | 11/1966 | Burns et al. ................. 340/173 |
| 5,631,863 A * | 5/1997 | Fechner et al. .............. 365/156 |
| 5,905,290 A * | 5/1999 | Houston ..................... 257/380 |
| 6,147,899 A | 11/2000 | Chan .......................... 365/156 |
| 6,975,532 B1 | 12/2005 | Kosonocky et al. ......... 365/154 |
| 7,184,299 B2 * | 2/2007 | Fournel et al. .............. 365/156 |
| 7,221,581 B2 * | 5/2007 | Jacquet et al. .............. 365/154 |

FOREIGN PATENT DOCUMENTS

| | | |
|---|---|---|
| DE | 2636377 | 3/1977 |
| FR | 2876490 | 4/2006 |

* cited by examiner

*Primary Examiner*—Tuan T Nguyen
*Assistant Examiner*—Hien N Nguyen
(74) *Attorney, Agent, or Firm*—Lisa K. Jorgenson; Allen, Dyer, Doppelt, Milbrath & Gilchrist, P.A.

(57) ABSTRACT

A memory cell stores information in the form of a first logic level and a second logic level that are complementary to each other. The memory cell includes a first storage circuit and a second storage circuit for storing the first logic level and the second logic level. The first and second storage circuits each have a respective input and output. An isolation circuit provides electrical isolation of the input of the first storage device from the output of the second storage device, except during access to the first and second storage circuits.

23 Claims, 1 Drawing Sheet

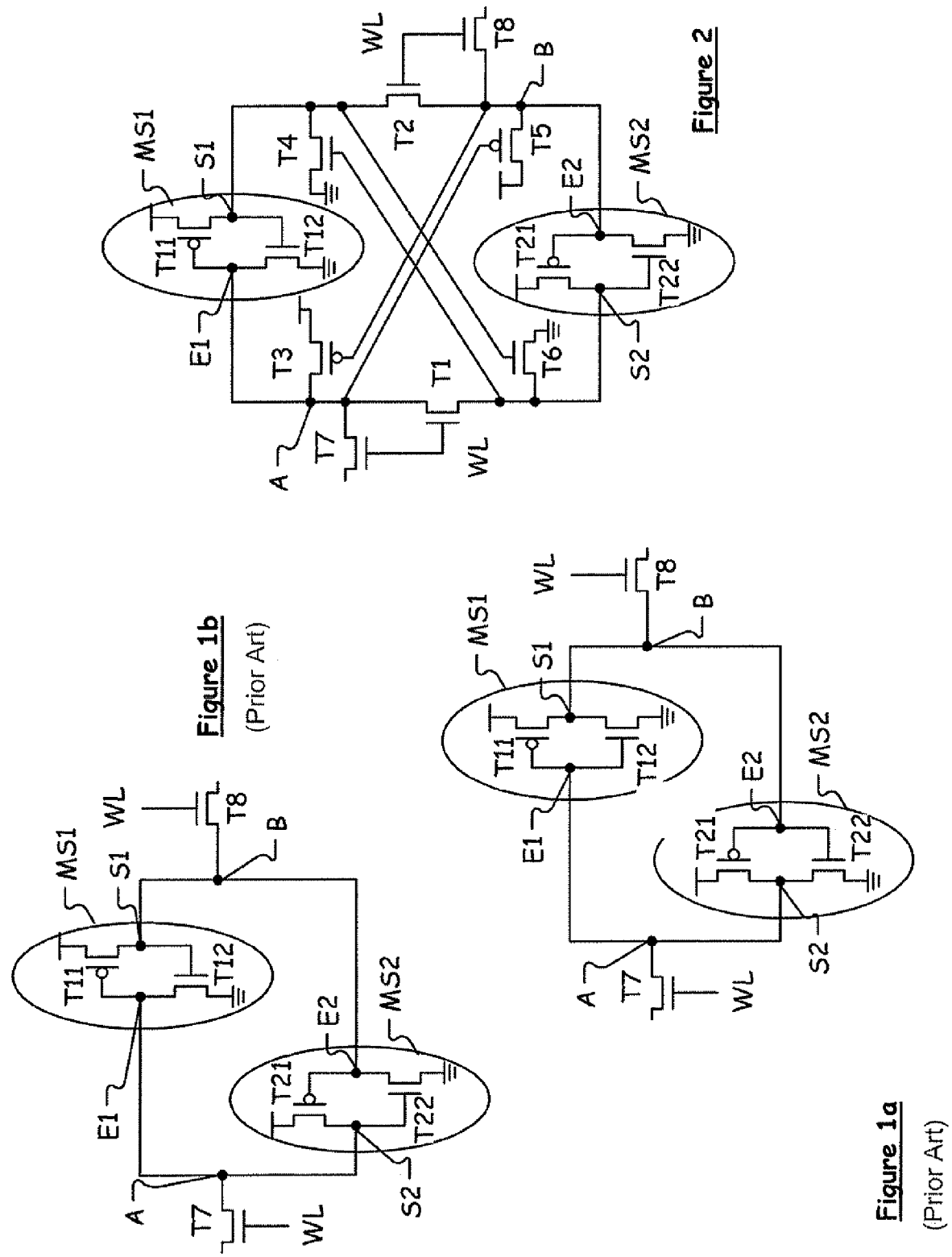

LOGIC CELL PROTECTED AGAINST RANDOM EVENTS

FIELD OF THE INVENTION

The invention relates generally to a memory cell for storing information in the form of first and second logic levels that are complementary to each other, and more particularly, to a memory cell comprising first and second storage circuits for respectively storing the first and second logic levels.

BACKGROUND OF THE INVENTION

A memory cell comprising first and second storage circuits for storing first and second logic levels includes (FIGS. 1a, 1b) two storage points A and B, and two access transistors T7 and T8 of an appropriate type. Such a memory cell may be of the SRAM type. Each access transistor connects a storage point of the cell to an associated row of words WL or /WL (complementary to WL), and to storage means or circuits MS1, MS2 connected back-to-front relative to each other. The storage points A, B store complementary logic levels.

In the example of FIG. 1a, the storage circuits MS1, MS2 of the memory cell, also known as latches, are two inverters connected back-to-front relative to each other between the storage points A, B. Each inverter is formed by two different types of transistors series-connected between a power supply terminal VDD of the inverter, and ground GND of the circuit. The common drain of the transistors forms the output of the inverter, and the common gate of the transistors form the input of the inverter.

In the example of FIG. 1b, the storage circuits MS1, MS2 of the memory cell each comprise two transistors connected back-to-front relative to each other. The first storage circuit MS1 includes transistors T11, T12. The second storage circuit MS2 includes transistors T21, T22. From an electrical viewpoint, behavior of the memory cells of FIGS. 1a and 1b are the same. The cells differ simply by the connection of the transistors T12 and T22.

To program a logic 1 in the cell of FIG. 1b, an active access signal WL is applied to the gates of the transistors T7 and T8, and complementary potentials are applied to the sources of the transistors T7 and T8. For example, VDD may be applied to the source of T7, and GND may be applied to the source of T8.

During the programming of a logic 1, the second storage circuit MS1 is active. The transistors T21, T22 are on, and the potential VDD (corresponding to the logic 1) appears at output S2, and the potential GND appears at input E2 (corresponding to a logic 0).

On the contrary, the first storage circuit MS2 is passive. The transistors T11, T12 are off. The potential VDD at the input E1 is dictated by the potential at the output S2, and the potential GND at the output S1 is dictated by the potential at the input E2. Naturally, to program a logic 0, an active access signal WL is applied to the gates of the transistors T7, T8, and inverse complementary potentials are applied to the sources of the transistors T7, T8. GND may be applied to the source of T7, and VDD may be applied to the source of T8. Behavior of the first and second storage circuits are inverted relative to the case where a logic 1 is programmed.

To read the content of the cell of FIG. 1b, the active access signal WL is simply applied to the gates of the transistors T7, T8, and the potentials at the sources of the transistors T7, T8 are measured.

The memory cells are highly sensitive to the logic random events (or soft errors), i.e., the loss of information at the storage point where one of the two logic levels is stored. This may be caused by an addition of energy that comes from external the memory cell and is not wanted.

The logic random events or soft errors may have different origins. A logic random event is caused, for example, by the impact of an energy particle, for example a heavy ion, at a storage point of the circuit. Such a logic random event is known as a Single Event Upset (SEU). A logic random event can also be induced by one-time capacitive coupling between two layers of a same integrated circuit. The term frequently used in this case is glitch or single event transient (SET).

Electronic circuits are increasingly sensitive to logic random events, and when there is a reduction in the size of their components. Thus, for circuits made with technologies of 0.25 μm or less, the logic random events are far too frequent to be overlooked.

Inasmuch as the trend is towards the use of ever smaller technologies, and especially technologies smaller than 0.25 μm, the problems of sensitivity of the electronic circuits now commonly appear in the field of computer hardware as well as in a variety of fields such as transportation, avionics, medical equipment, etc.

The impact of an energy particle or the capacitive coupling of two layers gives rise to a contribution of charge in the circuit which generally results in a current spike and a voltage spike on a digital or analog signal, at a point of a circuit. This may be for example, the point of impact in the case of a SEU, a coupling point in the case of a glitch, etc. The voltage variation is generally very brief, typically on the order of a few picoseconds to a few hundreds of picoseconds.

The voltage variation, however, may have a very high amplitude in a SRAM cell. The storage point of the SRAM cell behaves like a capacitor that charges the electron/hole pairs created during the impact of the energy particle or during the capacitive coupling of two layers. If C denotes the value of the capacitance and $\Delta Q$ denotes the variation in charge of the capacitance resulting from the contribution of external charges, this results in a variation in voltage $\Delta V$ at the terminals of the capacitance such that $\Delta V=\Delta Q/C$.

Current technologies enable the making of circuits whose dimensions are ever smaller. The capacitance C of the storage points may then attain very low values so that, even for a small quantity of charges $\Delta Q$, the voltage variation $\Delta V$ may reach a high level. A major variation in voltage may cause the logic level, stored in the storage point that undergoes the voltage variation, to switch over. The switch-over of a logic level then causes the switch-over of the complementary logic level. Since the complementary logic levels confirm each other, the memory cell is in a stable state different from the initial state.

For example, after the programming of a logic 1 in the cell of FIG. 1b, the potential at the point A is equal to VDD and the potential at the point B is equal to GND. The second storage circuit is active. If a logic random event, for example, disturbs the gate of the transistor T22, the potential VDD is immediately restored at the gate by the transistor T21 which is on.

The first storage circuit, on the contrary, is passive. If a random error disturbs, for example, the gate of the transistor T12, the transistor T11 which is inactive is not able to restore the potential GND at the gate of T12. T12 comes on and the potential GND appears at the drain of T11 (with the switch-over of the first storage circuit) as well as at the gate of T22 which goes off. The gate of T12 and the drain of T11 then impose the potential VDD on the gate of T11 and the drain of T22 (switch-over of the second storage circuit). The memory cell has thus changed states.

To address this problem, U.S. Pat. Nos. 6,147,899 and 5,570,313 propose the making of double cells comprising two single cells (as shown in FIG. 1a or 1b) connected back-to-front relative to each other so that, if the content of the single cell is disturbed by a random event, the other cell restores the content of the disturbed single cell.

These approaches, however, are not satisfactory. Indeed, they display assymmetrical sensitivity depending on the storage point which receives external charges. Also, they may be difficult to implement in an integrated circuit since they imply two bulky cells which are difficult to bring close together, links between the two cells that are lengthy and difficult to position between the components of these two cells, and sensitivity which although reduced remains high, etc.

SUMMARY OF THE INVENTION

In view of the foregoing background, an object of the present invention is to provide a memory cell that is better protected against random events, and is easier to implement than prior-art memory cells.

This and other objects, advantages and features in accordance with the present invention are provided by a memory cell capable of storing information in the form of a first logic level and a second logic level that are complementary to each other, and comprising first storage means or circuit and second storage means or circuit each capable of storing the first logic level and the second logic level.

The memory cell may also comprise an isolation means or circuit for the electrical isolation, except during access to the memory cell, of one input of the first storage circuit from one output of the second storage circuit, and/or one input of the second storage circuit from one output of the first storage circuit.

During an access to the memory cell, to record information in the memory cell or to read the content of the memory cell, the isolation circuit may connect the first storage circuit and the second storage circuit. The behavior of the memory cell is identical to the behavior of a prior art memory cell. However, outside access to the memory cell, i.e., outside phases of writing to or reading the memory cell and especially when the memory cell is in an information-retaining phase, the first storage circuit and the second storage circuit may be isolated from each other. Thus, a modification of the content in one of the storage circuits following a logic random event does not cause the switch-over of the other storage circuit. The right information is thus preserved in the memory cell.

The memory cell may further comprise a restoration means or circuit to electrically connect the input of the first storage circuit to the input of the second storage circuit, and/or the output of the second storage circuit to the output of the first storage circuit.

When there is no write or read access to the memory cell, if a logic random event modifies the content of one of the storage circuits, then the restoration circuit enables the other storage circuit to restore the erroneous content, as shall be seen more clearly below.

BRIEF DESCRIPTION OF THE DRAWINGS

The invention will be understood more clearly and other features and advantages shall appear from the following description of examples of implementation of an electronic circuit according to the invention. The description, which is made by way of an indication and in no way restricts the scope of the invention, is made with reference to the appended drawings, of which:

FIGS. 1a and 1b are schematic diagrams of SRAM memory cells not protected against random events according to the prior art; and FIG. 2 is a schematic diagram of a memory cell according to the present invention.

DETAILED DESCRIPTION OF THE PREFERRED EMBODIMENTS

As stated above, the invention relates to a memory cell that is capable of storing information in the form of first and second logic levels complementary to each other. Just as in the case of the prior art cell, the cell in accordance with the invention comprises a first storage circuit MS1 and a second storage circuit MS2. Each storage circuit is capable of storing the first logic level and the second logic level.

If the cell stores a logic 1, the first logic level is equal to VDD which is a supply potential of the cell, and the second logic level is equal to a ground potential, for example. Inversely, if the cell stores a logic 0, the first logic level is equal to the ground potential and the second logic level is equal to the potential VDD, for example.

The first storage circuit MS1 comprises an input E1 and an output E2 storing respectively the first level and the second level. The second storage circuit comprises an input E2 and an output S2 storing respectively the second level and the first level.

The cell also has access means or circuit for read and write access to the first storage circuit and the second storage circuit. In the example of FIG. 2, the access circuit comprises a transistor T7 and a transistor T8. The transistor T7 has a drain connected to the input of the first storage circuit and an access signal WL is applied to its control gate. The transistor T8 has a drain connected to the input of the second storage circuit and the access signal WL is applied to its gate.

In the cell of FIG. 1b, the first storage circuit comprises a transistor of a first type T11 and a transistor of a second type T12. The transistor of the first type T11 has one gate connected to the input of the storage circuit, and one channel connected between a first supply terminal VDD and the output of the storage circuit. The transistor of the second type T12 has one gate connected to the output of the storage circuit, and one channel connected between the input of the storage circuit and a second power supply terminal GND.

The transistors T11, T12 are thus connected back-to-front relative to each other. The gate of the transistor T11 and the drain of the transistor T12 are connected together to the input E1 of the first storage means. The gate of the transistor T12 and the drain of the transistor T11 are connected together to the output S1 of the first storage means. The supply potential VDD is applied to the source of the transistor T11, and the source of the transistor T12 is grounded. The second storage means are made according to a similar scheme and comprise two transistors T21, T22.

The cell also has isolation means or circuit for the electrical isolation, except during access to the memory cell, of the input E1 of the first storage circuit from the output S2 of the second storage circuit, and/or the input E2 of the second storage circuit from the output S1 of the first storage circuit.

Thus, during a read or write access to the cell, the first storage circuit and the second storage circuit are electrically connected. Operation of the cell of FIG. 2 is, in this case, identical to the operation of the cell of FIG. 1b during an operation of writing or reading of the cell.

On the contrary, outside of access to the cell (i.e., during the retention phase of the cell), the first storage circuit and the second storage circuit are isolated from each other. A random event that disturbs the passive storage circuits (MS1 or MS2 according to the value programmed in the cell) will not cause the active storage circuits (MS2 or MS1 depending on the value programmed in the cell) to switch over.

In the example of FIG. 2, the isolation circuit comprises a first transistor T1 and/or a second transistor T2. The first transistor T1 has a channel connected between the input E1 of the first storage circuit S1 and the output S2 of the second storage circuit MS2. The second transistor T2 has a channel connected between the input E2 of the second storage circuit MS2 and the output S1 of the first storage circuit MS1.

In the example of FIG. 2 as well, the access circuit and the isolation circuit are activated by the same access signal (WL) for access to the memory cell. To this end, the signal WL is applied to the gates of the transistors T1, T2 on the one hand and T7, T8 on the other. This is due to the choice of N-type transistors for the transistors T1, T2, T7, T8.

However, it is also possible to choose P-type transistors, which are complementary to the N-type transistors, for the transistors T1, T2 (with T7, T8 remaining N-type transistors) or for the transistors T7, T8 (with T1, T2 remaining N-type transistors), or else for the transistors T1, T2, T7, T8. The P-type transistors will then be controlled by a complementary signal /WL.

The memory cell is advantageously complemented by restoration means or circuit to electrically connect the input E1 of the first storage circuit MS1 to the input E2 of the second storage circuit MS2, and/or the output S2 of the second storage circuit to the output S1 of the first storage circuit MS1.

The following is the utility of the restoration circuit. Outside the phases of read or write access to the memory cell of FIG. 2, i.e., outside the phases of programming or reading the memory cell, the isolation circuit (transistors T1, T2) are open and the storages MS1, MS2 are cut off from each other. If a random event modifies the information contained in the isolation circuit which is passive (MS1 or MS2 as the case may be), then in a subsequent read access to the memory cell, there is a risk of a conflict appearing between the erroneous information contained in the passive storage circuit and the accurate information contained in the active storage circuit.

The restoration circuit averts this conflict. They enable the active storage circuit, especially outside the phases of access to the memory cell, to restore erroneous information in the passive storage means. Any risk of a subsequent conflict is thus eliminated.

In the example shown in the figure, the restoration circuit comprises the following:

a third transistor T3, one gate of which is connected to the input of the second storage circuit, and one drain of which connected to the input of the first storage circuit, and/or a fourth transistor T4, one gate of which is connected to the output of the second storage circuit, and one drain of which connected to the output of the first storage circuit, and/or a fifth transistor T5, one gate of which is connected to the input of the first storage circuit, and one drain of which connected to the input of the second storage circuit, and/or a sixth transistor T6, one gate of which is connected to the output of the storage circuit, and one drain of which is connected to the output of the first storage circuit.

The source of T3 and the source of T5 are connected to the supply terminal VDD. The source of T4 and the source of T6 are connected to the supply terminal GND (ground of the circuit).

That which is claimed is:

1. A memory cell for storing information in the form of a first logic level and a second logic level that are complementary to each other, the memory cell comprising:

a first storage circuit and a second storage circuit for storing the first and second logic levels, said first and second storage circuits each having a respective input and output; and an isolation circuit for electrical isolation of the input of said first storage circuit from the output of said second storage circuit, except during access to said first and second storage circuits.

2. A memory cell according to claim 1, wherein said isolation circuit further electrically isolates the input of said second storage circuit from the output of said first storage circuit, except during access to said first and second storage circuits.

3. A memory cell according to claim 1, wherein said isolation circuit comprises a first transistor comprising a channel connected between the input of said first storage circuit, and the output of said second storage circuit.

4. A memory cell according to claim 3, wherein said isolation circuit further comprises a second transistor comprising a channel connected between the input of said second storage circuit, and the output of said first storage circuit.

5. A memory cell according to claim 2, further comprising a restoration circuit to electrically connect the input of said first storage circuit to the input of said second storage circuit, and the output of said second storage circuit to the output of said first storage circuit.

6. A memory cell according to claim 5, wherein said restoration circuit comprises:

a third transistor comprising a gate connected to the input of said second storage circuit, and a drain connected to the input of said first storage circuit;

a fourth transistor comprising a gate connected to the output of said second storage circuit, and a drain connected to the output of said first storage circuit;

a fifth transistor comprising a gate connected to the input of said first storage circuit, and a drain connected to the input of said second storage circuit; and a sixth transistor comprising a gate connected to the output of said first storage circuit, and a drain connected to the output of said second storage circuit.

7. A memory cell according to claim 1, further comprising access transistors coupled to said first and second memory circuits.

8. A memory cell according to claim 7, wherein said access transistors are activated by a same access signal.

9. A memory cell according to claim 1, wherein each of said first and second storage circuits comprises:

a transistor of a first type comprising a gate connected to the input, and a channel connected between a first supply input and the output; and a transistor of a second type comprising a gate connected to the output, and a channel connected between the input and a second supply terminal.

10. A memory device comprising:

a plurality of memory cells for storing information in the form of first logic levels and second logic levels that are complementary to each other, each memory cell comprising a first storage circuit and a second storage circuit for storing corresponding first and second logic levels, said first and second storage circuits each having a respective input and output, and an isolation circuit for electrical isolation of the input of said first storage circuit from the output of said second storage circuit, except during access to said first and second storage circuits.

11. A memory device according to claim 10, wherein said isolation circuit further electrically isolates the input of said second storage circuit from the output of said first storage circuit, except during access to said first and second storage circuits.

12. A memory device according to claim 10, wherein said isolation circuit comprises:
   a first transistor comprising a channel connected between the input of said first storage circuit, and the output of said second storage circuit; and
   a second transistor comprising a channel connected between the input of said second storage circuit, and the output of said first storage circuit.

13. A memory device according to claim 11, further comprising a restoration circuit to electrically connect the input of said first storage circuit to the input of said second storage circuit, and the output of said second storage circuit to the output of said first storage circuit.

14. A memory device according to claim 13, wherein said restoration circuit comprises:
   a third transistor comprising a gate connected to the input of said second storage circuit, and a drain connected to the input of said first storage circuit;
   a fourth transistor comprising a gate connected to the output of said second storage circuit, and a drain connected to the output of said first storage circuit;
   a fifth transistor comprising a gate connected to the input of said first storage circuit, and a drain connected to the input of said second storage circuit; and
   a sixth transistor comprising a gate connected to the output of said first storage circuit, and a drain connected to the output of said second storage circuit.

15. A memory device according to claim 10, further comprising access transistors coupled to said first and second memory circuits, said access transistors being activated by a same access signal.

16. A memory device according to claim 10, wherein each of said first and second storage circuits comprises:
   a transistor of a first type comprising a gate connected to the input, and a channel connected between a first supply input and the output; and
   a transistor of a second type comprising a gate connected to the output, and a channel connected between the input and a second supply terminal.

17. A method for operating a memory cell comprising first and second storage circuits, the method comprising:
   accessing the first and second storage circuits for storing first and second logic levels that are complementary to each other, the first and second storage circuits each having a respective input and output; and
   electrically isolating the input of the first storage circuit from the output of the second storage circuit, except during the accessing to the first and second storage circuits.

18. A method according to claim 17, further electrically isolating the input of the second storage circuit from the output of the first storage circuit, except during access to the first and second storage circuits.

19. A method according to claim 17, wherein the memory cell comprises an isolation circuit for providing the electrically isolating, the isolation circuit comprises a first transistor comprising a channel connected between the input of the first storage circuit, and the output of the second storage circuit; and a second transistor comprising a channel connected between the input of the second storage circuit, and the output of the first storage circuit.

20. A method according to claim 18, further comprising a restoration circuit for electrically connecting the input of the first storage circuit to the input of the second storage circuit, and the output of the second storage circuit to the output of the first storage circuit.

21. A method according to claim 20, wherein the restoration circuit comprises:
   a third transistor comprising a gate connected to the input of said second storage circuit, and a drain connected to the input of said first storage circuit;
   a fourth transistor comprising a gate connected to the output of said second storage circuit, and a drain connected to the output of said first storage circuit;
   a fifth transistor comprising a gate connected to the input of said first storage circuit, and a drain connected to the input of said second storage circuit; and
   a sixth transistor comprising a gate connected to the output of said first storage circuit, and a drain connected to the output of said second storage circuit.

22. A method according to claim 17, wherein the memory cell further comprises access transistors coupled to the first and second memory circuits, the access transistors being activated by a same access signal.

23. A method according to claim 17, wherein each of the first and second storage circuits comprises:
   a transistor of a first type comprising a gate connected to the input, and a channel connected between a first supply input and the output; and
   a transistor of a second type comprising a gate connected to the output, and a channel connected between the input and a second supply terminal.

* * * * *